United States Patent
Richardson et al.

(10) Patent No.: US 6,901,087 B1
(45) Date of Patent: May 31, 2005

(54) BROADBAND LASER SOURCE

(75) Inventors: David John Richardson, Southampton (GB); David Oliver Culverhouse, Southampton (GB); Seok Hyun Yun, Taejon (KR); Byoung Yoon Kim, Taejon (KR)

(73) Assignee: University of Southampton, Southampton (GB)

( * ) Notice: Subject to any disclaimer, the term of this patent is extended or adjusted under 35 U.S.C. 154(b) by 0 days.

(21) Appl. No.: 08/925,208

(22) Filed: Sep. 8, 1997

(30) Foreign Application Priority Data

Sep. 9, 1996 (GB) .............................................. 9618764

(51) Int. Cl.$^7$ ............................. H01S 3/10; H01S 3/30; H01S 3/117; H01S 3/13; H01S 3/08
(52) U.S. Cl. ............................. 372/20; 372/6; 372/13; 372/28; 372/32; 372/92; 372/94
(58) Field of Search ............................... 372/6, 10, 13, 372/20, 26, 28, 32, 39, 69, 70, 81, 92, 94, 98, 106; 359/326, 331

(56) References Cited

U.S. PATENT DOCUMENTS

| | | | |
|---|---|---|---|
| 5,189,676 A | 2/1993 | Wysocki et al. | 372/6 |
| 5,786,930 A * | 7/1998 | Takatsu et al. | 372/20 |

FOREIGN PATENT DOCUMENTS

| | | |
|---|---|---|
| EP | 0 524 382 A2 | 4/1992 |
| EP | 0 524 382 A3 | 4/1992 |
| EP | 000524382 A2 * | 1/1993 |

OTHER PUBLICATIONS

P.F. Wysocki, M.J.F. Digonnet, and B.Y. Kim, "Broad-spectrum, wavelength-swept, erbium-doped fiber laser at 1.55 μm", Optics Letters, Aug. 15, 1990 vol. 15, No. 16, pp. 879–881.

* cited by examiner

Primary Examiner—Minsun Oh Harvey
Assistant Examiner—Armando Rodriguez
(74) Attorney, Agent, or Firm—Iandiorio & Teska

(57) ABSTRACT

A broadband laser source comprising: a resonant cavity (1) containing a medium (2) which emits optical energy (3) in a continuum of wavelengths in response to application of pump energy (4) to the medium (2); a source of pump energy (5) for producing said optical energy (3); a frequency shifter (6) within the resonant cavity (1); and a tuneable spectral filter (7) within the resonant cavity (1), and the apparatus being such that in use the tuneable spectral filter (7) has a peak wavelength which is repeatedly swept in a substantially resonant fashion over a wavelength range equal to, or a fraction of, a linewidth of the broadband source such that the rate of change of the peak wavelength of the tuneable spectral filter (7) is substantially equal to the rate of change of the frequency of the optical energy (3) as it is frequency shifted within the resonant cavity (1) by the frequency shifter (6).

10 Claims, 14 Drawing Sheets

BROADBAND LASER SOURCE

This invention relates to a broadband laser source and, more especially, to a wavelength-swept fiber laser source capable of being swept over large sweep ranges with a user-defined spectral shape and high average output powers. The broadband laser source may be for application in sensor systems.

There is a demand in the area of optical fibre sensors for sources of broad bandwidth optical energy for use as optical monitors and probes of optical sensor systems. Broad bandwidth sources can be used to interrogate both interferometric based systems such as Sagnac loop based rotation sensors as well as sensor systems based on arrays of one or more narrow bandwidth fibre Bragg gratings.

Most broadband sources output directly amplified spontaneous emission to provide broadband optical energy. They have not therefore required the use of a resonant cavity. Although the coherence and polarisation properties of the emitted radiation are ideal for many applications such amplified spontaneous emission based sources are not generally capable of simultaneously providing high output powers and sufficiently broadband output. Moreover, they are generally inefficient with regard to input pump energy. In addition the shape of the output spectrum is determined by the shape of the gain medium's fluorescent linewidth.

Wavelength swept lasers are also known that provide broadband optical energy. In this instance, the output is broad band in a time average sense. At any instant in time, the output radiation is in fact narrowband. However, the central bandwidth of the output is repeatedly swept over a broad spectral range which can be equal to, or a fraction of, the gain medium's emission linewidth.

Wavelength swept lasers can be classified into two classes. The first class is where only a purely wavelength tuning element is incorporated within a resonant cavity to rapidly tune the lasing wavelength. In the first class, the output is at any instant laser-like, that is narrow band with a well defined optical mode structure and polarisation which can lead to problems for sensor applications. As the wavelength is tuned, the cavity is prone to mode-hop thereby making the discrete changes in central frequency rather than continuous tuning. Moreover the laser tuning ranges are generally much narrower than the full emission bandwidth of the gain medium.

The second class is where the laser includes a device in the cavity which simultaneously provides explicit filtering of the circulating optical energy, but where the device induces a frequency shift. In the second class, the narrowband radiation is at any instant amplified-spontaneous-emission-like, since the frequency shift restricts the build up of a conventional laser mode structure. The laser tunes continuously. However the instantaneous source bandwidth, although narrower than both the filter bandwidth and emission medium linewidth, is generally too broadband to facilitate many applications that make use of the wavelength swept nature of the output optical energy. Furthermore, resonant cavities containing both a narrowband filter and a frequency shifter have been shown to have a strong tendency to generate optical pulses which strongly restrict their usefulness.

An aim of the present invention is to provide a broadband laser source capable of being swept over large sweep ranges without the problems of pulsing, dis-continuous wavelength tuning, restricted wavelength tuning and large instantaneous linewidths, inherent with previous implementations. A further aim is to allow a user-defined spectral shape coupled with high average output powers.

According to a non-limiting embodiment of the present invention, there is provided a broadband laser source comprising: a resonant cavity containing a medium which emits optical energy in a continuum of wavelengths in response to application of pump energy to the medium; a source of pump energy for producing said optical energy; a frequency shifter within the resonant cavity; and a tuneable spectral filter within the resonant cavity, and the apparatus being such that in use the tuneable spectral filter has a peak wavelength which is repeatedly swept in a substantially resonant fashion over a wavelength range equal to, or a fraction of, a linewidth of the broadband source such that the rate of change of the peak wavelength of the tuneable spectral filter is substantially equal to the rate of change of the frequency of the optical energy as it is frequency shifted within the resonant cavity by the frequency shifter.

The rate of change of the frequency of the optical energy should normally be resonant to within an accuracy of around plus or minus 10% of the resonant condition. The exact value will be dependent upon the round trip losses in the cavity, the length of the cavity, the gain flatness of the medium, the birefringence in the cavity and other wavelength filtering elements within the cavity. Failure to meet the resonant condition may result in broadening of the instantaneous linewidth and potential pulsing instabilities.

The medium may be in a waveguide form such as a rare earth doped optical fibre or rare earth doped planar waveguide structure, or it may be a semiconductor waveguide structure.

The medium may be an optical amplifier such as an Erbium-doped optical fibre amplifier which may have a noise figure well in excess of the quantum limited noise figure.

The medium may be in bulk form such as rare earth doped glass or a laser crystal.

The instantaneous bandwidth of the laser light emitted from the broadband laser source is less than the time-averaged bandwidth of the laser light emitted from the broadband laser source, which is less than the bandwidth of the optical energy emitted by the medium in response to application of pump energy when the medium is not placed inside the cavity.

The pump energy may be supplied in the form of electrical or optical energy.

The tuneable spectral filter and the frequency shifter may be embodied in a single device which simultaneously provides both functions such as an acousto-optic tuneable filter.

The tuneable spectral filter may be an electronically and/or mechanically-tuned fabry-perot filter, a mechanically tuned dielectric filter, a strain and/or a temperature tuned fibre Bragg grating, a filter based on a mechanically tuned diffraction grating, a liquid crystal device, or a filter based on interferometric principles.

The frequency shifter may be an acousto-optic Bragg cell, an electro-optic single sideband phase modulator, or a fibre based acousto-optic frequency shifter.

The resonant cavity may be a ring structure which contains a rare-earth doped single-mode optical fibre, an optical isolator, an input fibre coupler for coupling the pump energy into the resonant cavity, and an output fibre coupler through which broadband laser light exits the resonant cavity.

The rare-earth doped single-mode optical fibre may be an optical fibre amplifier which may have a noise figure in excess of 15 dB.

The resonant cavity may be a unidirectional laser structure which contains a rare-earth doped single-mode optical fibre, an optical isolator for ensuring unidirectional operation, an input fibre coupler for coupling the pump energy into the resonant cavity, and an output fibre coupler through which broadband laser light exits the resonant cavity.

The resonant cavity may be a fabry-perot structure.

The fabry-perot structure may be formed by an optical fibre having first and second ends and having a reflector positioned near the first end of the optical fibre in which the reflector is substantially reflective to the optical energy and substantially transmissive to the pump energy.

In a first embodiment of the present invention, the broadband laser source includes an output coupling arrangement containing at least one narrow bandwidth optical filter.

The narrow bandwidth optical filters may be optical fibre Bragg gratings which may be implemented in an array along one or more optical fibres.

The broadband laser source with the output coupling arrangement is useful for certain sensing applications to transform both the spectral and temporal distribution of the optical energy emitted from the cavity. For example since the optical energy output radiation is at any one instance spectrally narrower than the time-averaged linewidth of the broadband source (and the said filter bandwidth), and has a central frequency that is being force to follow the sweep in the frequency of the tuneable spectral filter, the reflection from an array of at least one fibre grating of narrow reflection bandwidths relative to the filter sweep range and with peak reflectivity wavelengths lying within the sweep range can be used to generate a multi-wavelength train of optical pulses of optical energy with central frequencies defined by the peak reflectivity frequencies of the fibre gratings.

In a second embodiment of the present invention, the attenuation through the tuneable spectral filter is independently controlled as the peak wavelength of the tuneable spectral filter is swept.

The peak wavelength of the tuneable spectral filter and the attenuation of the tuneable spectral filter may be provided by control signals which are phase locked. The control signals may be derived from frequency synthesisers or arbitrary function generators which are phase locked.

The peak wavelength of the tuneable spectral filter and the attenuation of the tuneable spectral filter may be swept synchronously to generate broadband laser light of precise time average spectral characteristics.

The present invention also provides sensing apparatus comprising an array of environmentally-sensitive narrow-band reflectors and the broadband laser source.

The present invention also provides sensing apparatus comprising at least one interferometer and the broadband laser source.

Embodiments of the invention will now be described solely by way of example and with reference to the accompanying drawings in which.

Figure 1:
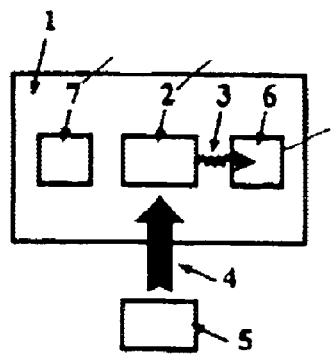
FIG. 1 shows a broadband laser source comprising resonant cavity, a source of pump energy, a frequency shifter and a tuneable spectral filter.

With reference to FIG. 1, there is shown a broadband laser source comprising: a resonant cavity 1 containing a medium 2 which emits optical energy 3 in a continuum of wavelengths in response to application of pump energy 4 to the medium 2; a source of pump energy 5 for producing said optical energy 3; a frequency shifter 6 within the resonant cavity 1; and a tuneable spectral filter 7 within the resonant cavity 1, and the apparatus being such that in use the tuneable spectral filter 7 has a peak wavelength which is repeatedly swept in a substantially resonant fashion over a wavelength range equal to, or a fraction of, a linewidth of the broadband source such that the rate of change of the peak wavelength of the tuneable spectral filter 7 is substantially equal to the rate of change of the frequency of the optical energy 3 as it is frequency shifted within the resonant cavity 1 by the frequency shifter 6.

Figure 2:
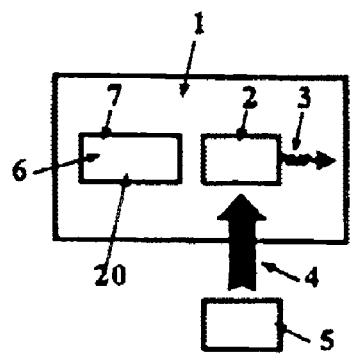
FIG. 2 shows a broadband laser source where the tuneable spectral filter and the frequency shifter are embodied in an acousto-optic tuneable filter.

With reference to FIG. 2, there is shown a broadband laser source in which the tuneable spectral filter 7 and the frequency shifter 6 are embodied in an acousto-optic tuneable filter 20.

Figure 3:
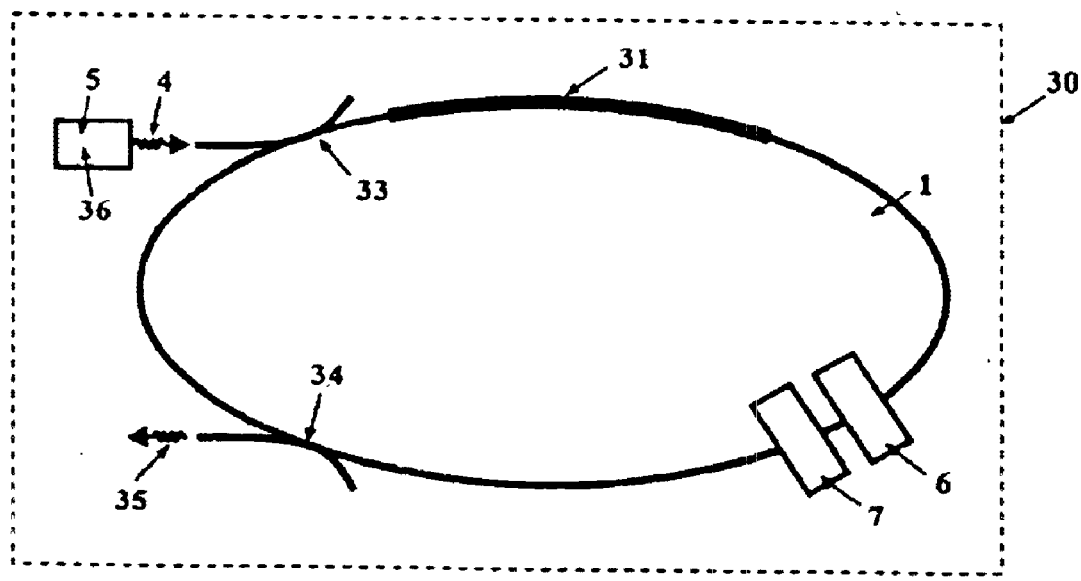
FIG. 3 shows a broadband laser source where the resonant cavity is implemented in a ring structure.

With reference to FIG. 3, there is shown a broadband laser source in which the resonant cavity 1 is a ring structure 30 which contains a rare-earth doped single-mode optical fibre 31, an input fibre coupler 33 for coupling the pump energy 4 from a fibre pig-tailed pump 36 into the resonant cavity 1, and an output fibre coupler 34 through which broadband laser light 35 exits the resonant cavity 1.

If the rare-earth doped single-mode optical fibre 31 is an erbium-doped optical fibre, then the fibre pig-tailed pump 36 would preferably be a semiconductor laser diode with a wavelength of 980 nm or 1480 nm designed for inclusion in commercial Erbium fibre amplifiers for the telecommunication industry. It is generally preferable to incorporate an isolator to ensure that the laser has unidirectional operation to prevent instabilities.

Figure 4:
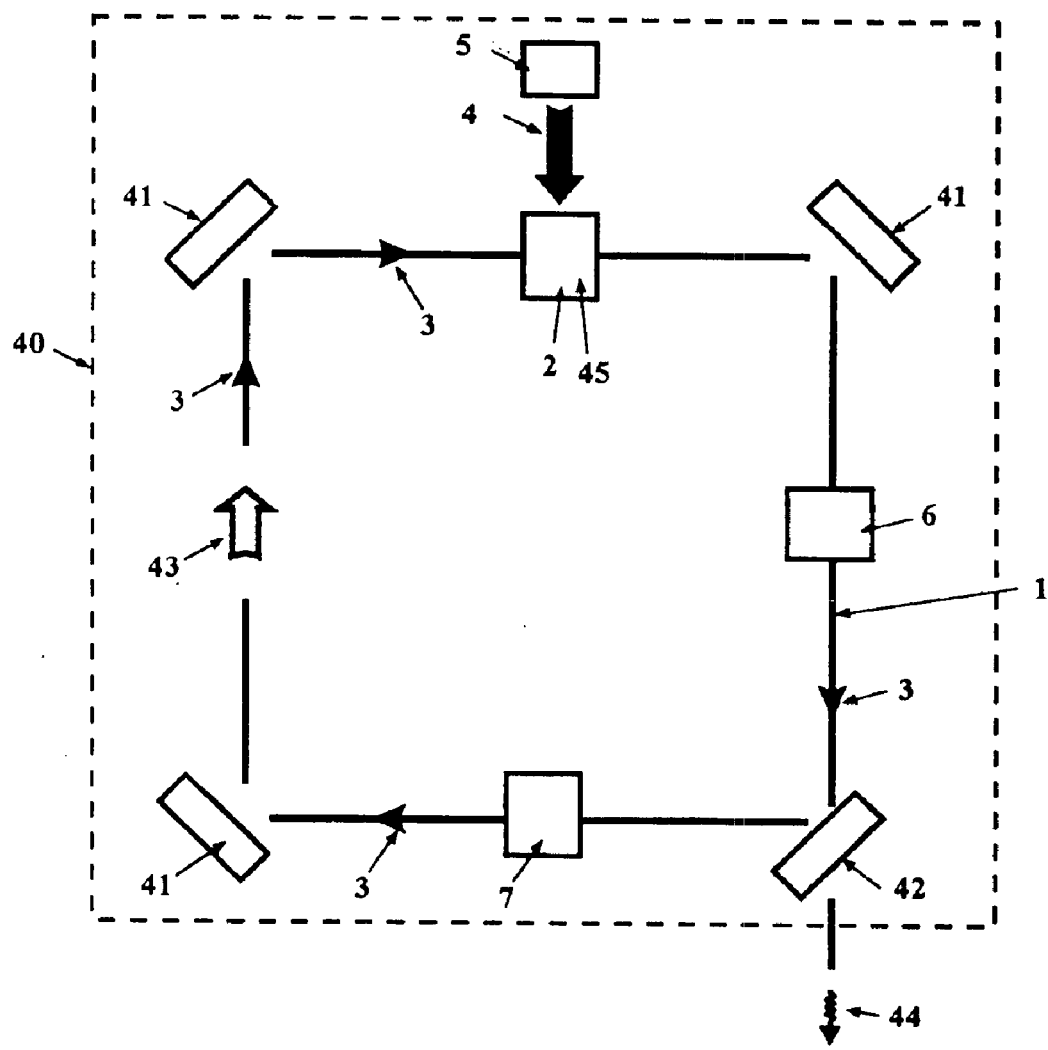
FIG. 4 shows a broadband laser source where the resonant cavity is implemented as a unidirectional laser structure.

With reference to FIG. 4, there is shown a broadband laser source in which the resonant cavity 1 is a unidirectional laser structure 40 constructed with mirrors 41 and an output coupler 42 through which broadband laser light 44 exits the resonant cavity 1. The medium 2 is a bulk medium 45 such as a crystal of titanium sapphire or a rare-earth doped glass. An optical isolator 43 is incorporated into the cavity 1 for ensuring unidirectional operation.

Figure 5:
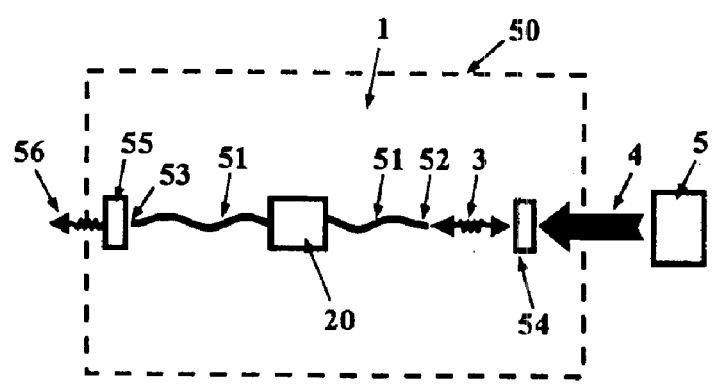
FIG. 5 shows a broadband laser source where the resonant cavity is implemented as a Fabry Perot structure.

With reference to FIG. 5, there is shown a broadband laser source in which the resonant cavity 1 is a fabry-perot structure 50 formed by an optical fiber 51 having first and second ends 52, 53 and having a reflector 54 positioned near the first end 52 of the optical fibre 51 in which the reflector 54 is substantially reflective to the optical energy 3 and substantially transmissive to the pump energy 4. An acousto-optic filter 20 is incorporated into the cavity 1. An output coupler 55 forms the end of the cavity through which broadband laser light 56 exits the cavity 1. Lenses may be required between the first and second ends 52, 53 and the reflector 54 and the output coupler 55. Alternatively, the first and second ends 52, 53 may be butt-coupled to the reflector 54 and the output coupler 55.

Figure 6:
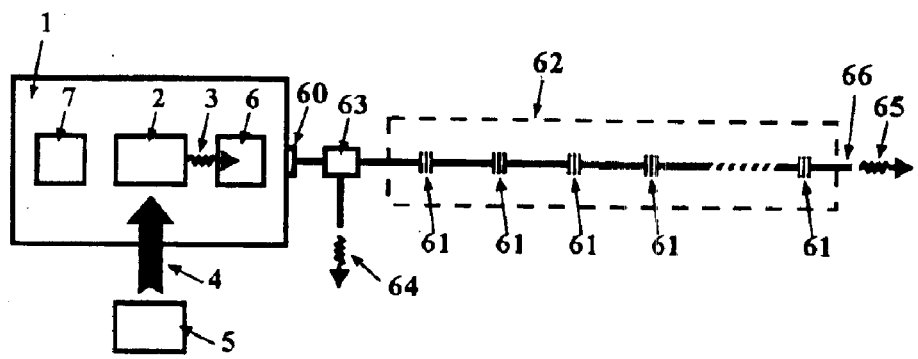
FIG. 6 shows a broadband laser source containing narrow bandwidth optical filters.

With reference to FIG. 6, there is shown a broadband laser source comprising: a resonant cavity 1, containing a medium 2 which emits optical energy 3 in a continuum of wavelengths in response to application of pump energy 4 to the medium 2; a source of pump energy 5 for producing the optical energy 3; an output coupling arrangement 60 containing at least one narrow bandwidth optical filter 61; a frequency shifter 6 within the resonant cavity 1; and a tuneable spectral filter 7 within the resonant cavity 1, and the apparatus being such that in use the tuneable spectral filter 7 has a peak wavelength which is repeatedly swept in a substantially resonant fashion over a wavelength range equal to, or a fraction of, a linewidth of the broadband source such that the rate of change of the peak wavelength of the tuneable spectral filter 7 is substantially equal to the rate of change of the frequency of the optical energy 3 as it is frequency shifted within the resonant cavity 1 by the frequency shifter 6.

In FIG. 6, the narrow bandwidth optical filters 61 are shown implemented in an array 62. The narrow bandwidth optical filters 61 may preferably be optical fibre Bragg gratings which may be written into a single optical fibre. Pulsed broadband laser light 64 may be obtained in reflective mode from the array 62 by separating means 63 which may be preferably a circulator, a beam splitter, an optical fibre coupler, a polarisation beam splitter, or a pelicule. Complementary pulsed broadband laser light 65 is emitted from the end of the array 66.

Figure 7:
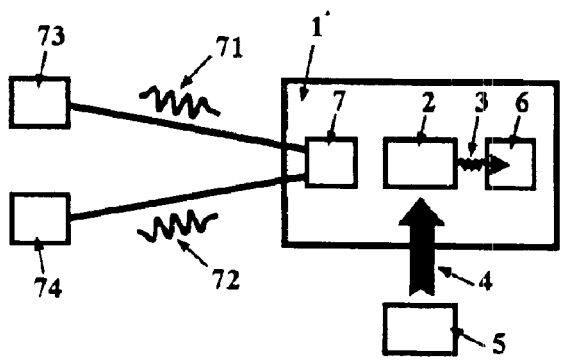
FIG. 7 shows a broadband laser source where the attenuation through the tuneable spectral filter is independently controlled.

With reference to FIG. 7, there is shown a broadband laser source comprising: a resonant cavity 1 containing a medium 2 which emits optical energy 3 in a continuum of wavelengths in response to application of pump energy 4 to the medium 2; a source of pump energy 5 for producing the optical energy 3; a frequency shifter 6 within the resonant cavity 1; and a tuneable spectral filter 7 within the resonant cavity 1, and the apparatus being such that in use the tuneable spectral filter 7 has a peak wavelength which is repeatedly swept in a substantially resonant fashion over a wavelength range equal to, or a fraction of, a linewidth of the broadband source such that the rate of change of the peak wavelength of the tuneable spectral filter 7 is substantially equal to the rate of change of the frequency of the optical energy 3 as it is frequency shifted within the resonant cavity 1 by the frequency shifter 6 and in which the attenuation through the tuneable spectral filter 7 is independently controlled as the peak wavelength of the tuneable spectral filter 7 is swept.

The peak wavelength of the tuneable spectral filter 7 and the attenuation of the tuneable spectral filter 7 are provided by control signals 71, 72 which may be phase locked, synchronous or asynchronous. The control signals 71, 72 may be derived from frequency synthesisers 73, 74.

Figure 8:
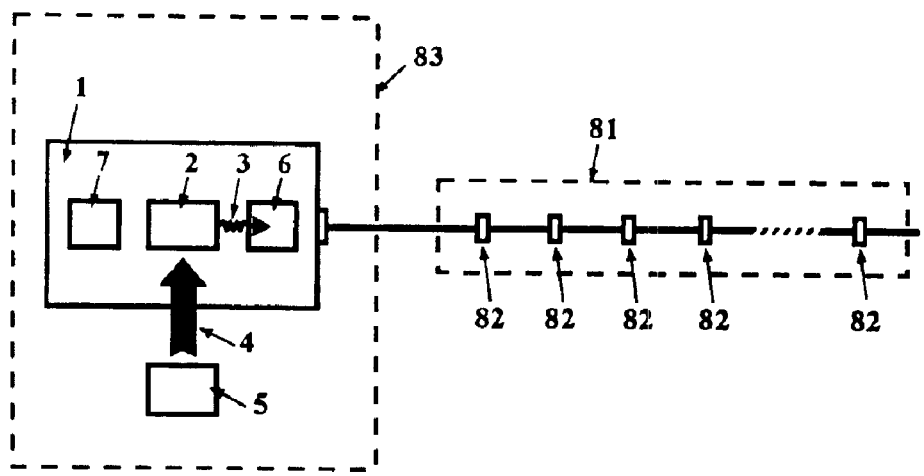
FIG. 8 shows sensing apparatus comprising a broadband laser source and an array of environmentally-sensitive narrow-band reflectors.

With reference to FIG. 8, there is shown sensing apparatus comprising an array 81 of environmentally-sensitive narrow-band reflectors 82 and a broadband laser source 83. The broadband laser source 83 may be any embodiment of the broadband laser sources described herein.

An example of the use of such a sensing apparatus is where the broadband laser source is employed as a wavelength swept laser source and the environmentally-sensitive narrow-band reflectors 82 are constructed from optical fibre Bragg gratings. The wavelength of light reflected from the optical fibre Bragg gratings is known to be sensitive to temperature and strain. Readout instrumentation such as a high speed oscilloscope can therefore be used to display the reflected light from the array 81 and the temporal position of each reflected pulse used to identify the optical fibre Bragg grating and to infer the wavelength reflected. Hence the local environmental parameter at the respective optical fibre Bragg grating can be determined. It would also be possible to separate the individual optical fibre Bragg gratings using spectral measurements of the reflected radiation if each optical fibre Bragg grating reflected light at a different wavelength.

Figure 9:
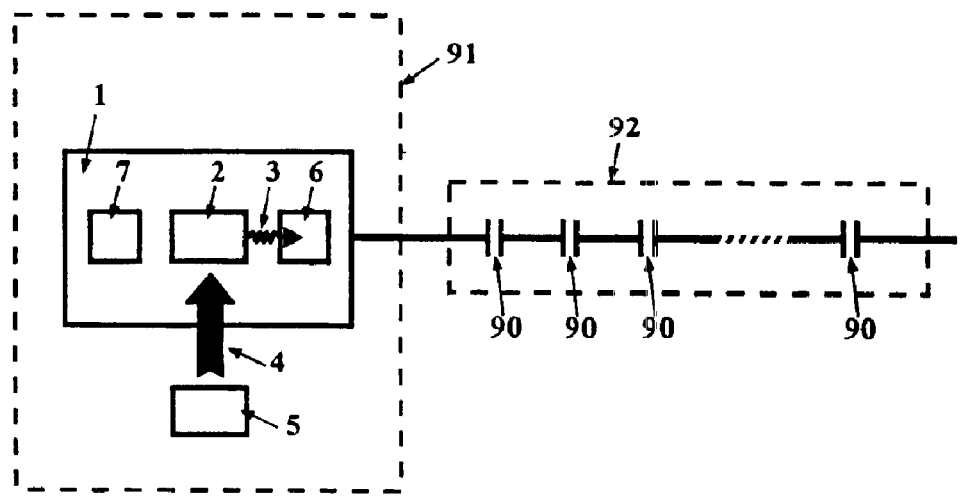
FIG. 9 shows sensing apparatus comprising a broadband laser source and an array of interferometers.

With reference to FIG. 9, there is shown sensing apparatus comprising at least one interferometer 90 and a broadband laser source 91. By scanning the broadband laser source 91 in a similar manner to that described in FIG. 8, it is possible to separate the returns from individual interferometers 90 in time. The reflected light can therefore be interrogated with readout electro-optic instrumentation (not shown) using one of the many techniques known in the art and the measurements from each interferometer 90 demultiplexed temporally. It would also be possible to separate the individual interferometers using wavelength division multiplexing of the reflected radiation if each interferometer 90 reflected light at a different wavelength.

Figure 10:
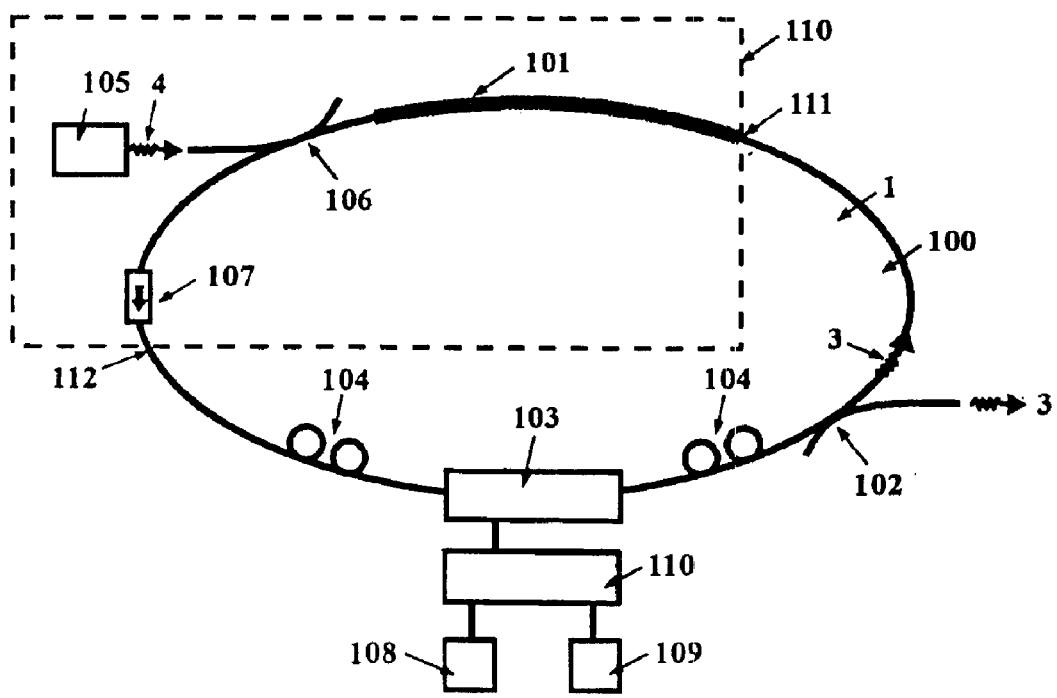
FIG. 10 shows a preferred embodiment of the invention in a unidirectional ring geometry.

FIG. 10 shows a preferred embodiment of the broadband laser source which is a wavelength swept fibre laser 100. The wavelength swept fibre laser 100 is in a unidirectional ring configuration and comprises a rare-earth doped fibre 101, an output fibre coupler 102, an acousto-optic tuneable filter 103, polarisation controllers 104, a pump laser 105, an input fibre coupler 106, an isolator 107, a first synthesiser 108 for controlling the peak wavelength of the acousto-optic tuneable filter 103 and a second synthesiser 109 for controlling the optical attenuation through the acousto-optic tuneable filter 103. In use, the peak wavelength of the acousto-optic tuneable filter 103 is repeatedly swept in a substantially resonant fashion over a wavelength range equal to, or a fraction of, a linewidth of the broadband source such that the rate of change of the peak wavelength of the acousto-optic tuneable filter 103 is substantially equal to the rate of change of the frequency of the optical energy 3 as it is frequency shifted within the resonant cavity 1 by acousto-optic tuneable filter 103.

The first and second synthesisers 108 and 109 are preferably phase locked.

The rare earth doped fibre 101 is preferably an erbium doped optical fibre.

The pump laser 105 is preferably a fibre-pigtailed semiconductor laser.

The rare-earth doped fibre 101, pump laser 105, input coupler 106 and isolator 107, are shown configured as an optical amplifier 110. It may preferable in certain embodiments, to have an isolator 107 located at both the input 111 of the optical amplifier 110 and the output 112 of the optical amplifier 110.

The combined effects of frequency-shifted feedback and optical filtering within a laser cavity can lead to a number of interesting regimes of laser operation and has attracted considerable attenuation within recent years. Most work in the area to date has considered the cavities in which light experiences a fixed frequency shift per round-trip and is filtered by a bandpass filter of fixed transmission, bandwidth and central frequency.

The preferred embodiment shown in FIG. 10 provides a high spectral brightness modeless laser output. However, if the acousto-optic tuneable filter 103 is not swept in wavelength, pulsed operation can occur.

In the modeless laser case, the acousto-optic tuneable filter 103 is not swept and the laser source is a frequency shifted laser. In a frequency shifted laser, the frequency shift per round-trip prevents a coherent build up of the laser mode-structure resulting in a broadband, mode-less output with a spectral envelope determined by the characteristics of the drive signals to the acousto-optic tuneable filter 103 and the magnitude of the frequency shift.

In pulsed operation however, trains of short (typically 10 ps–1 ns) pulses are generated. The pulsed operation is self starting, and, unlike active mode-locking, does not require any resonance matching of the frequency shift per round-trip to the round-trip frequency of the cavity 1.

The tendency for pulsing is particularly strong in frequency-shifted fiber lasers where stable trains of mode-locked pulses are typically generated. This may be attributable to the nonlinear Kerr effect occurring within the optical fiber. Frequency-shifted fiber lasers intrinsically favour pulsed rather than continuous wave operation because a nonlinear pulse, restoring its spectrum by self phase modulation after being shifted away from the peak transmission wavelength of the acousto-optic tuneable filter 103, experiences less loss in the acousto-optic tuneable filter 103 than linear radiation.

Another way of viewing the pulse formation process is that the self phase modulation of the intra-cavity field acts as a phase seeding mechanism, establishing a phase distribution throughout the spectrum and eventually the formation of stable optical pulses. Such pulsed laser operation has much in common with the use of sliding-frequency filters for soliton control within soliton communications systems. In this instance, the central frequencies of noise reduction filters within a transmission line are slid such that soliton pulses, which can adjust their central frequencies to pass through the filtered line through the combined influence of nonlinearity and dispersion, suffer lower loss than linear radiation allowing for enhanced soliton transmission. Techniques for suppressing this pulsing in frequency shifted fibre lasers are a key issue if one is interested in operating them in a mode-less laser mode.

With recent developments of acousto-optic tuneable filters it has become possible to envisage fiber laser cavities in which the filtering and frequency shift per round-trip are no longer fixed quantities but become time dependent. In particular, the possibility to rapidly and smoothly change the central frequency of a filter transmission peak by electronic means should allow for rapid, continuous sweeping of the output wavelength of a fiber laser. Such wavelength-swept fiber lasers have a wide number of applications ranging from low coherence interferometry, sensor interrogation, device instrumentation and characterisation through to techniques such as optical frequency-domain reflectometry. In particular, wavelength swept fibre lasers offer an attractive option for simple and effective spectral demultiplexing schemes in fiber grating sensors, providing higher spectral densities and narrower spectral resolution than the conventional methods utilising a combination of broadband sources and scanning narrowband receivers.

The principal factor determining the operation of a wavelength swept fibre laser relates to the interplay of the frequency shift (wavelength shift) and change in the peak wavelength of the tuneable spectral filter 7 per round-trip. Consider a wavelength swept fibre laser having a filter and a frequency shifter in the cavity. On each round-trip, the laser spectrum in the cavity is shifted in frequency by $f_{FS}$ and reshaped by the spectral filter whose peak frequency (wavelength) is shifted by $f_{filter}$ in one round-trip. In a spectral reference frame moving with the filter passband, the filter peak frequency is static, but the laser spectrum is shifted by $f_{FS}-f_{filter}$. The output characteristics of the wavelength swept fibre laser are therefore largely predictable from those of a conventional frequency shifted fibre laser with an unswept filter and an effective frequency shift $f_{FS}-f_{filter}$ per round-trip.

Figure 11:
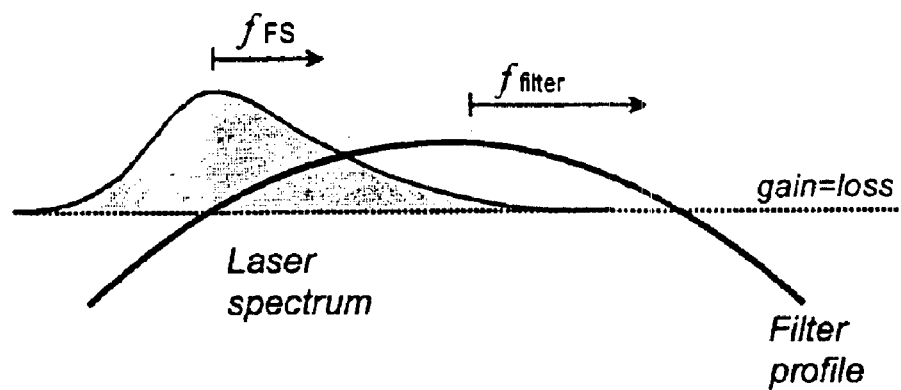
FIG. 11 shows theoretical results on the spectral shape of the emitted instantaneous broadband laser light.
Figure 12:
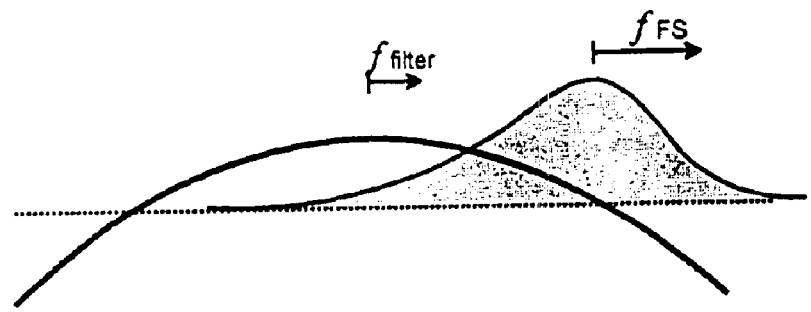
FIG. 12 shows theoretical results on the spectral shape of the emitted instantaneous broadband laser light.
Figure 13:
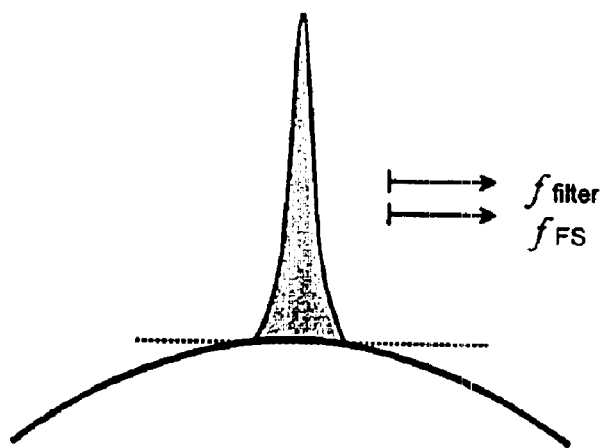
FIG. 13 shows theoretical results on the spectral shape of the emitted instantaneous broadband laser light.

A simple analytic model was developed which ignored the influence of nonlinearity to predict the spectral characteristics of a frequency shifted fibre laser. The model showed that the envelope of the frequency shifted fibre laser output spectrum at a given optical power is determined only by the filter bandwidth, the frequency shift, and the spectral density of the spontaneously emitted light in the gain medium. The model also showed that the steady-state spectrum has its peak offset from the filter peak frequency. The offset frequency and the linewidth were proportional to, approximately, $b^{2/3}f_{FS}^{1/3}$ and $b^{2/3}|f_{FS}|^{1/3}$, respectively, where b is the filter bandwidth. This, on its own, implies both the offset and linewidth are minimised in the wavelength swept fibre laser case by matching the filter sweep rate to the frequency shift, i.e., $f_{filter}=f_{FS}$. This is illustrated in FIGS. 11, 12 and 13. In this resonant case, amplified spontaneous emission light generated under the filter peak at the start of the filter sweep remains under the peak as the filter is swept across the amplifier gain profile and consequently experiences significant spectral narrowing with respect to the non resonant case. From a nonlinear perspective one may also expect that this would lead to a reduction in the tendency of the wavelength swept fibre laser to pulse since, in the resonant case, it should be narrowband linear radiation moving under the peak center rather than a nonlinear pulse that should experience the least loss. In terms of the previous fibre swept fibre laser analogy with controlled soliton transmission systems, the resonantly swept wavelength swept fibre laser (for example, the preferred embodiment shown in FIG. 10) corresponds to a soliton transmission line with fixed filters with the same central frequency.

A full numerical simulation code for a wavelength swept fibre laser was developed and investigated to ascertain the influence of nonlinearity and amplified spontaneous emission noise within the system. The results of the simulation showed that resonant sweeping of the intra-cavity filter can help in the suppression of pulsing in such systems but also that amplified spontaneous emission noise can also play a major part in this pulsing suppression. The addition of strong, randomly-phased, amplified spontaneous emission noise to the re-circulated, non-linearly generated seed signal can prevent the build up a constant phase relationship across the emission spectral bandwidth, thereby frustrating the formation of pulsed output. In order to enhance the wavelength swept fibre lasers stability one should therefore use a doped fibre amplifier with a large noise figure and/or operate the system at high gain for example with large output coupling within the system.

An experimental validation of the preferred embodiment shown in FIG. 10 of the broadband laser source (a resonantly-swept wavelength swept fibre laser) was conducted. The acousto-optic tuneable filter 103 was a bulk-optic device based on polarisation conversion, although any other form of acousto-optic tuneable filter may be used. Furthermore it would be possible to have separate components to perform the filtering and frequency shifting functions, for example a scanning fabry perot filter and an acousto-optic Bragg cell. The frequency shift associated with the acousto-optic tuneable filter 103 was around −68 MHz and the acousto-optic tuneable filter 103 had a 4 nm bandwidth around 1550 nm. The transmission peak wavelength of the acousto-optic tuneable filter 103 was tuned around 1550 nm by variation of the drive frequency of the acousto-optic tuneable filter 103 which had a slope coefficient of −20.6 nm/MHz. The total insertion loss of the acousto-optic tuneable filter 103 was 2.5 dB for 0.7-W applied power. The first and second synthesisers 108 and 109 were two commercially-available arbitrary function generators which were phase locked. The attenuation through the acousto-optic tuneable filter 103 was linearly dependent on the output voltage from the second synthesiser 109 and the peak wavelength of the acousto-optic tuneable filter was linearly dependent upon the voltage from the first synthesiser 108. We could therefore synchronously and independently control the attenuation and the peak wavelength of the acousto-optic tuneable filter 103 as a function of time.

The preferred embodiment shown in FIG. 10 was evaluated by implementing the optical amplifier 110 with a first amplifier (not shown) and a second amplifier (not shown) in turn. The first amplifier was based upon a 10-m-long Erbium/Ytterbium co-doped fiber, backward pumped by a diode-driven Neodymium-YLF laser giving 600-mW maximum fiber-coupled output power at 1047 nm. The first amplifier was considerably over length from conventional amplifier design perspective resulting in a large noise figure which was measured to be 20 dB (at 1555 nm) under operating conditions similar to those experienced within the cavity 1. The saturated output power from the first amplifier was 22 dBm and maximum small signal gain 22 dB (at 1550 nm).

The second amplifier was a low-noise, erbium-doped fibre amplifier pumped in a co-propagating geometry with a 100 mW, 980 nm diode laser. The small signal gain of the second amplifier was 38 dB at the 1532 nm gain peak, and the saturated output power was 13 dBm. The noise figure of the second amplifier was measured to be 5 dB at the gain peak. Although these experiments were performed using erbium doped, silica fibres operating at 1550 nm fibre amplifiers based on other rare earth dopants e.g. Ytterbium, Neodymium, Thulium and glass hosts such as Fluoride fibres, Chalcogenide fibres etc. may be used within such broadband sources to obtain operation at other wavelengths. Furthermore, elaborate fibre types may be used as cladding pump fibres which permit the pump energy to be derived from (high power) broad stripe laser diodes and which would allow for much higher output power levels—up to the multi-watt regime.

The output coupler 102 coupled 90% of the optical energy out of the cavity 1, but other values of output coupling, both higher and lower, could also be used. The total length of the cavity 1 was around 20 m when the cavity 1 contained either the first amplifier or second amplifier. Control of the intra-cavity birefringence was provided through incorporation of two polarisation controllers 104 in the cavity 1. The cavity 1 could alternatively be constructed from all polarisation maintaining components allowing robust, single polarisation state operation. The round-trip loss of the cavity 1 (excluding output coupling) was approximately 3 dB.

Operation of the broadband laser source was initially examined without scanning the peak wavelength of the acousto-optic tuneable filter 103 using first and second amplifiers in turn. Initially the second amplifier was used. Output coupling from the cavity 1 in this instance was arranged to be from the 10% port of the output coupler 102. The laser was found to produce self-starting pulses for almost all settings of the polarisation controllers 104 at a few 10's of mW of launched pump power. Pulsed operation was by far the preferred mode of operation for this laser configuration. The pulsing was characteristic of that of most forms of passively mode-locked solution fiber laser with chaotic pulsing at high average powers and stabilised pulse bunches at low pump power. Stable fundamental mode-locking was readily obtained by accurate control of the pump power. Pulsing was also largely sustained during resonant sweeping of the central frequency of the acousto-optic tuneable filter 103.

The second amplifier was then replaced with the first amplifier. In addition, the total loss of the cavity 1 was increased by taking the output from the 90% port of the output coupler 102. The amplified spontaneous emission noise power was consequently increased by two orders of magnitude relative to the previous experiment. In this instance, the laser output was typically a continuous wave. Only near the threshold pump power and by very careful alignment of the fiber polarisation controllers 104 was it possible to observe any form of pulsing. Once the peak wavelength of the acousto-optic tuneable filter was swept, any possibility for pulsed operation was completely lost. The modeless, continuous-wave linewidth was between 30–50 GHz depending on the laser output power.

The laser performance was systematically examined under swept operation for the cavity 1 incorporating the second amplifier and 90% output coupling from the output coupler 102. Initially the laser performance with a linear sweep in the peak wavelength of the acousto-optic tuneable filter 103 was examined. Practically this was achieved using a saw-tooth waveform from the first synthesiser 108. The peak wavelength of the acousto-optic tuneable filter was thereby linearly swept between fixed wavelength extremes defined by the amplitude and DC offset of the saw-tooth wave at a sweep frequency $f_{sweep}$. As the acoustic frequency is swept upward in frequency, the peak wavelength of the acousto-optic tuneable filter 103, and thereby the wavelength of the output radiation, is swept downward in wavelength. The resonant saw-tooth sweep frequency depended on the sweep range, length of the cavity 1 and frequency shift per pass induced by the acousto-optic tuneable filter 103. For example, in the case of a 20 nm (2.5 THz) sweep, $f_{FS}$=68 MHz and a cavity round-trip frequency of 10 MHz, the resonant sweep frequency is calculated to be 275 Hz. It should be noted that resonant sweeping across the full frequency range should actually require a slightly nonlinear wavelength variation with time since the acoustic shift per pass varies slightly as the peak wavelength of the acousto-optic tuneable filter 103 is swept. The 20 nm sweep requires a 1 MHz or ~1.5% variation in the magnitude of frequency shift. Exponential-type wavelength sweeps were designed to correct for this higher order effect but no significant difference was observed from the simpler linear sweep for the experimental measurements made to date. The acoustic amplitude was kept constant across the full frequency sweep range for our initial experiments.

Figure 14:
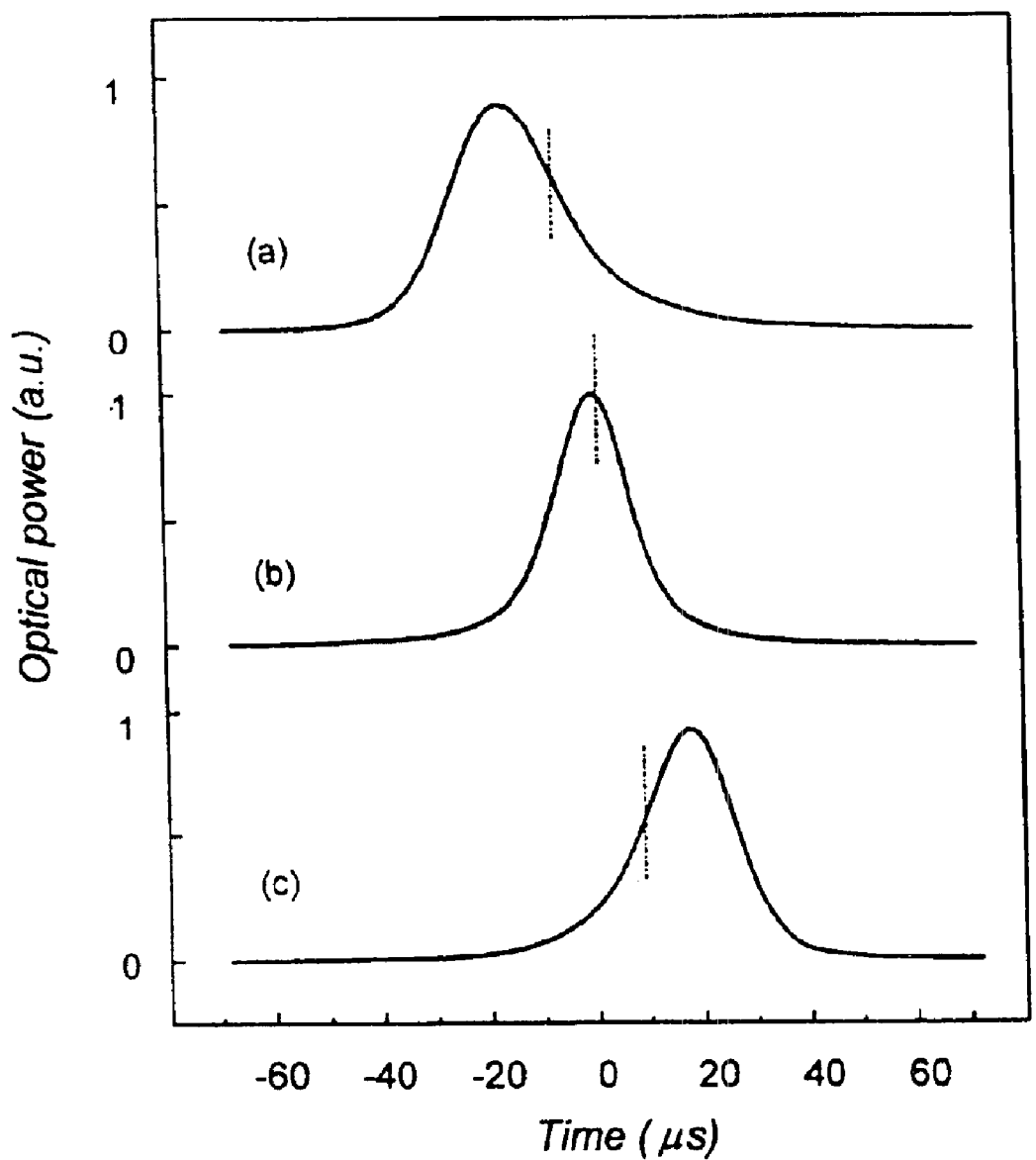
FIG. 14 shows experimental measurements on the spectral shape of the emitted instantaneous broadband laser light.

The instantaneous linewidth of the swept laser output as a function of sweep frequency was examined. The measurement was made at a fixed wavelength within the scan range by examining the temporal response of the reflection of the swept laser output from a fixed narrowband fiber grating (bandwidth 7 GHz, centered at 1558 nm) placed close to the broadband laser output. The plot in FIG. 14 shows the typical temporal return from the fiber grating at three different sweep frequencies of (a) 250 Hz, (b) 270 Hz, and (c) 290 Hz, for an output power of 3 mW. The temporal width of the reflected signal has a minimum around $f_{sweep}$=270 Hz. The reflected output deviates from a Gaussian either side of resonance (250 and 290 Hz). Assuming the offset frequency to be zero at $f_{sweep}$=270 Hz, the position of the peak frequency of the acousto-optic tuneable filter 103 is marked with a dotted line in FIG. 14, clearly illustrating that the pulse locates itself on opposite sides of the peak wavelength of the acousto-optic tuneable filter 103 on either side of resonance. On resonance the spectrum locates itself under the peak of the effective gain curve.

Figure 15:
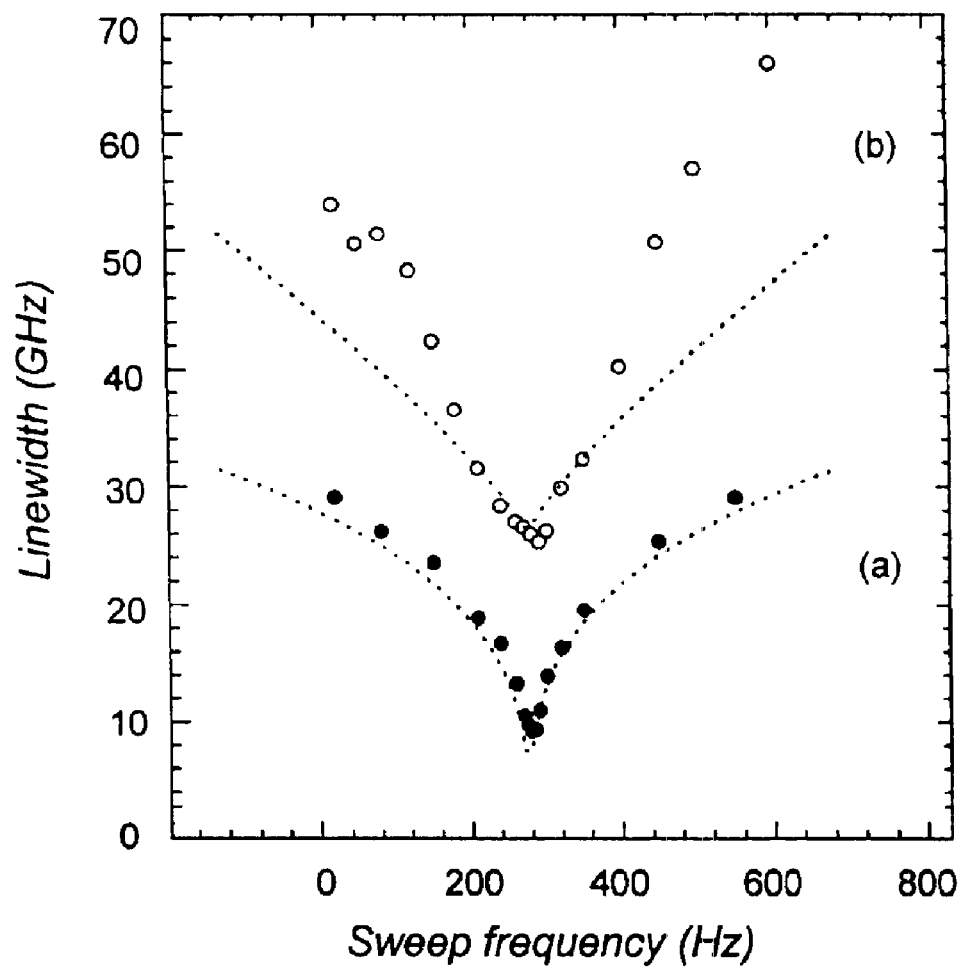
FIG. 15 shows experimental measurements on the linewidth of the instantaneous emitted broadband laser light as a function of filter sweep rate.

From this experiment, it was possible to measure the instantaneous linewidth and offset from the peak wavelength of the acousto-optic tuneable filter 103 as a function of sweep frequency. FIG. 15 shows the measured linewidth for the 20-nm wavelength sweep from 1544 nm to 1564 nm at two different output power levels of (a) 3 mW and (b) 100 mW. It is seen that a significant reduction in instantaneous linewidth was indeed observed as anticipated at a frequency of around 270 Hz, close to that predicted for resonant sliding of the filter peak. However, it should be noted that the exact position of the resonant peak varied slightly (+/−20 Hz) depending on the states of the polarisation controllers 104. This variation is attributed to the polarisation dependence of the acousto-optic tuneable filter 103 associated with the wavelength-dependent birefringence of the cavity 1. This effect locally affects the sliding rate of the overall gain shape and thereby the effective resonant sweep rate. At low output powers of a few mW, the measured linewidths were ~30 GHz away from resonance, however these narrowed up to as low as 9 GHz (0.072 nm) on resonance. At high output power of around 100 mW, the minimum achievable linewidths were limited to 25 GHz or so, as opposed to the non-resonant linewidths of order 50–60 GHz. The measurements were repeated for wavelength sweeps ranging from 2 to 38 nm for both linear and exact exponential wavelength sweeps but no further linewidth reduction was possible. From FIG. 15, it can be seen that appreciable spectral narrowing can be obtained for sweep rates in the range plus or minus 10% of the resonant sweep frequency of 270 Hz.

Figure 16:
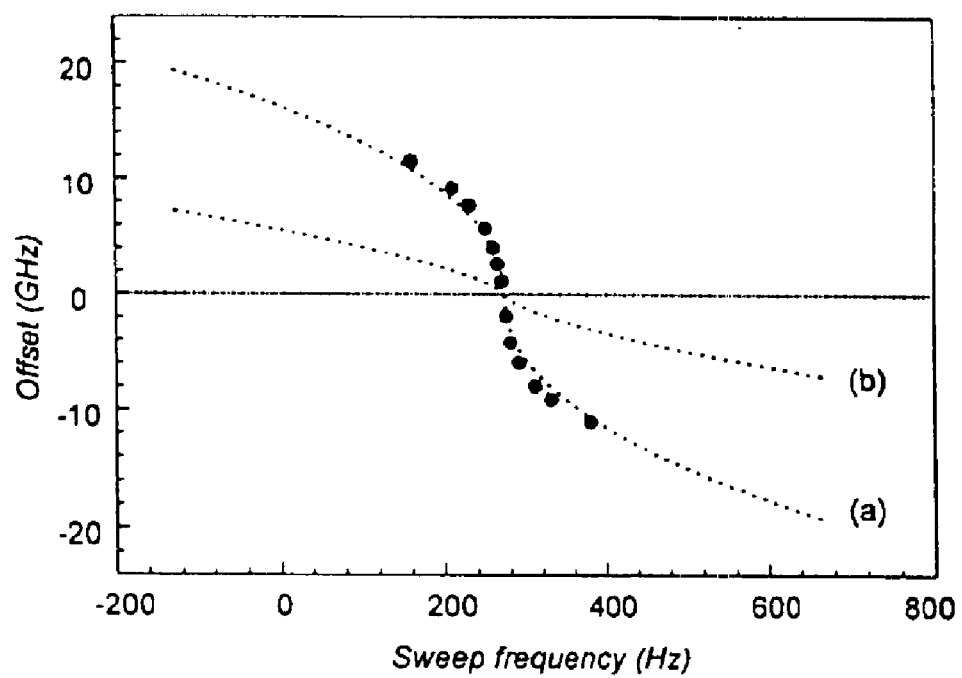
FIG. 16 shows experimental measurements on the position of the instantaneous emitted broadband laser light relative to the peak wavelength of the acousto-optic tuneable filter.

FIG. 16 shows the measured offset frequency between the spectral peak of the laser output and the centre frequency of the acousto-optic tuneable filter 103 for the 20 nm sweep at 3 mW output power level. As expected, the spectrum locates itself at opposite sides of the peak wavelength of the acousto-optic tuneable filter 103 for sweep frequencies greater and less than the resonant case.

The wavelength swept fibre laser for a variety of filter sweep frequencies around resonance was simulated. The initial noise spectrum was found to stabilize after an initial transient stage and reach the final steady state envelope after a few hundred to a few thousand round-trips, depending on the filter sweep rate. The spectral offset and width were measured and averaged from m=3000 to 4500 round-trips. The results for output powers of (a) 3 mW and (b) 100 mW, are shown by dashed lines in FIGS. 15 and 16. For these plots small-signal gains of 13.25 dB ($G_0$32 21.13) and 20.8 dB ($G_0$=120.2) were chosen for the 3 and 100 mW output powers, respectively, and the total cavity loss was 13 dB ($L_{tot}$=0.05).

From FIGS. 15 and 16, it is seen that the numerical modelling is in excellent agreement with the experimental observation, except for some discrepancy for the case of 100-mW output power, predicting both the expected fall off in linewidth for resonant sweeping, the correct spectral linewidth both on and off resonance and the correct degree of linewidth broadening associated with the increased output power. Interestingly, it was found from the simulations that without the nonlinear effect, i.e. $n_2$–0, as the output power increased, the spectrum moved farther away from the peak wavelength of the acousto-optic tuneable filter 103, and the linewidth decreased because of the increasing slope of the transmission profile of the acousto-optic tuneable filter 103. However, the opposite occurred when the nonlinearity was turned on, that is, as the output power increased, the offset decreased, and the linewidth increased, due to additional self-phase modulation.

Figure 17:
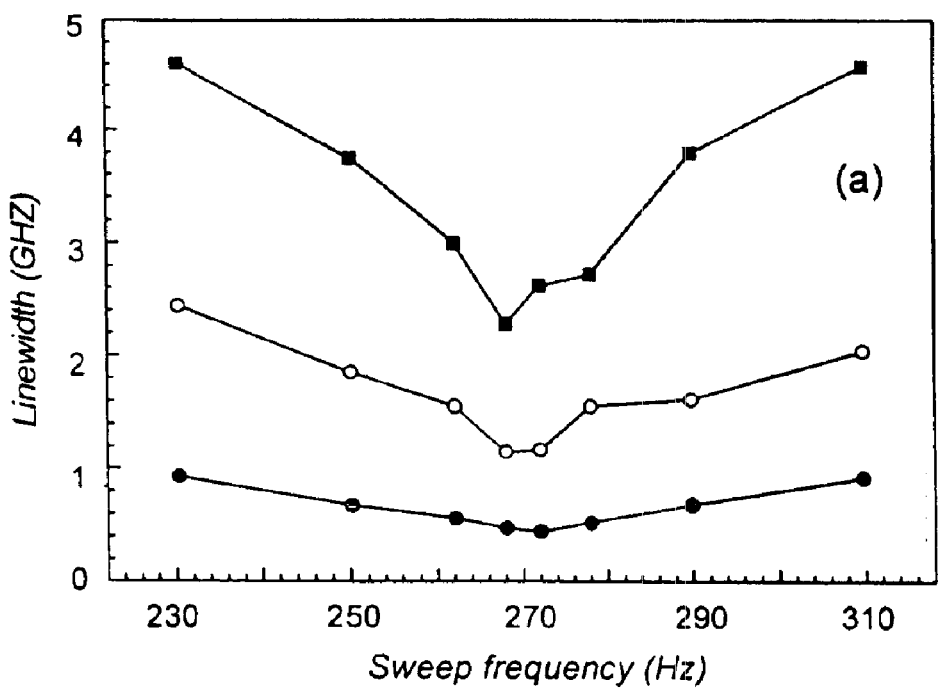
FIG. 17 shows theoretical estimates of the instantaneous emitted broadband laser light linewidth as a function of sweep frequency.
Figure 18:
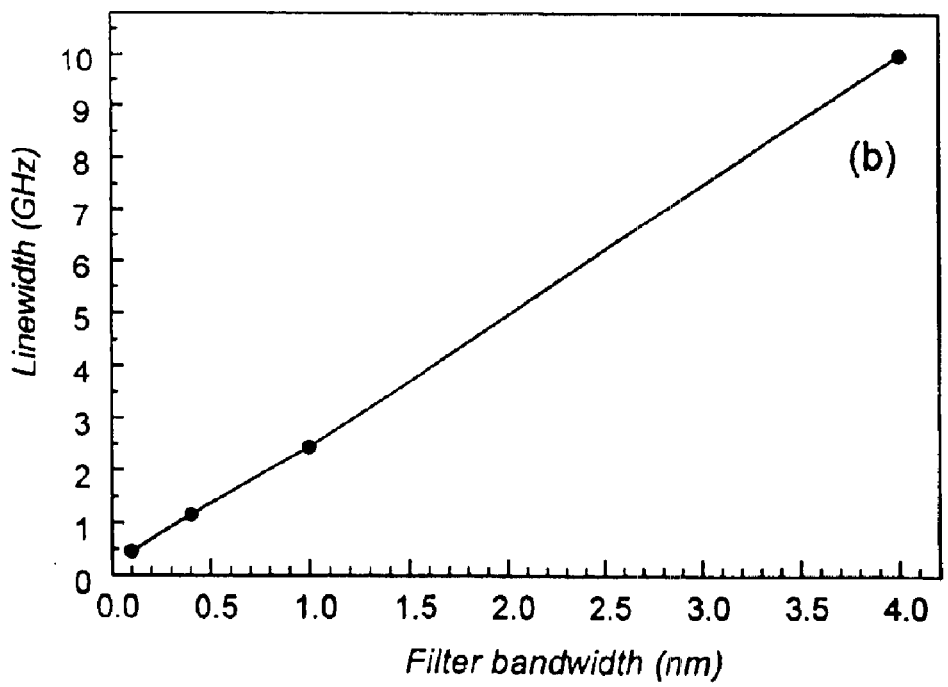
FIG. 18 shows theoretical estimates of the instantaneous emitted broadband laser light linewidth as a function of the acousto-optic filter bandwidth.

Having validated the numerical model against experimental data, investigations were then conducted into the possibility for further linewidth reduction by reduction of the bandwidth of the acousto-optic tuneable filter. The expected linewidth as a function of filter sweep rate at sweep rates around resonance are shown in FIG. 17 for values of the bandwidth of the acousto-optic tuneable filter 103 of 0.1, 0.4, and 1 nm. Significant reductions in linewidth were obtained on resources as with the 4 nm filter. A plot of the minimum (resonant) linewidth as a function of the bandwidth of the acousto-optic tuneable filter 103 is given in FIG. 18 where it is seen that considerable reductions in swept linewidth can be envisaged. For example, a 1-nm filter results in a swept bandwidth of 2.5 GHz (<0.02 nm).

Figure 19:
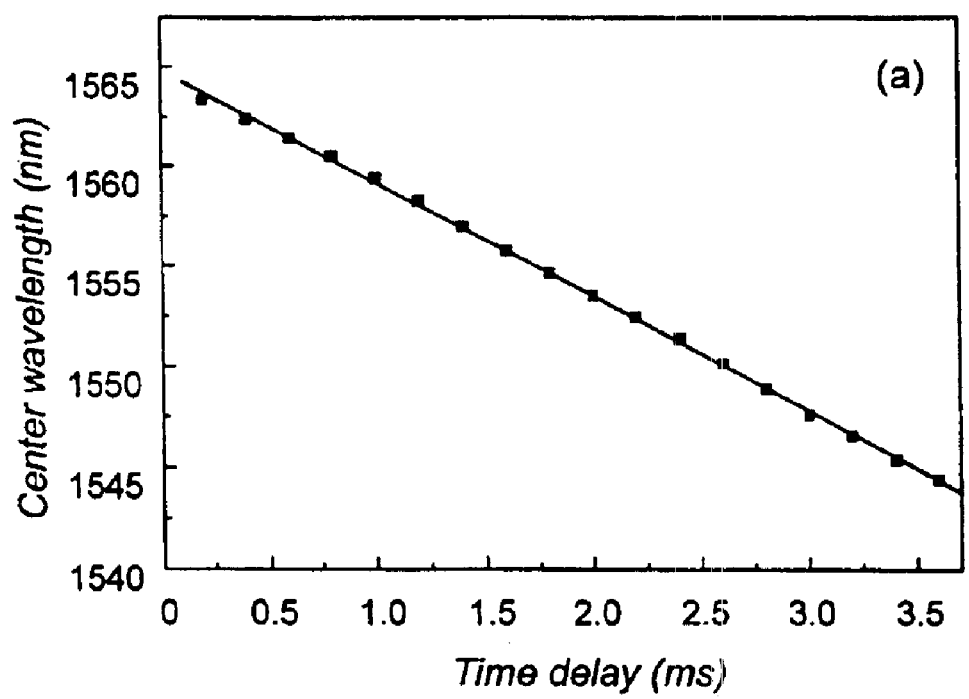
FIG. 19 shows experimental measurements on the linearity of the peak wavelength of the instantaneous emitted broadband laser light versus time.
Figure 20:
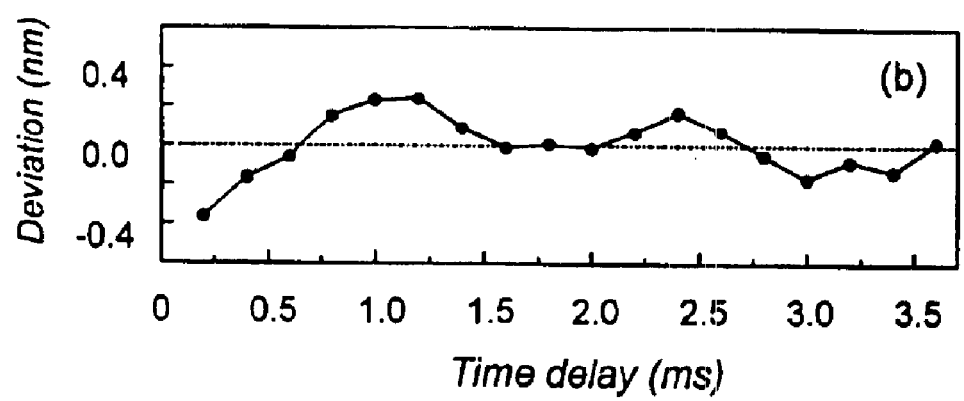
FIG. 20 shows experimental measurements on the deviations from linearity of the peak wavelength of the instantaneous emitted broadband laser light versus time.

In order to experimentally determine the absolute wavelength accuracy of the source across the full wavelength span, the output was sampled at fixed time delays from the start of the wavelength scan by using an acousto-optic switch at the output of the broadband laser source. The switch was held open for 2 μσ after a given delay time, and the peak wavelength of the output was measured on an optical spectrum analyser of 0.05-nm resolution using the max-hold, or average measurement option. The experimental values from the resonant tracked case could then be compared with that predicted from the calibrated, linear filter tuning characteristic. The results are plotted in FIG. 19 where it can be seen that reasonably linear tuning characteristics are obtained over the full scan. The root mean square deviation from the desired linear tuning curves was 0.153 nm with a peak-to-peak deviation of <0.4 nm over the 20 nm range [FIG. 20]. The deviations are attributed to the wavelength-dependent gain profile of the first amplifier and birefringence in the cavity 1 and could in principle be eliminated by higher order corrections of the sweep characteristics of the acousto-optic tuneable filter 103.

Figure 21:
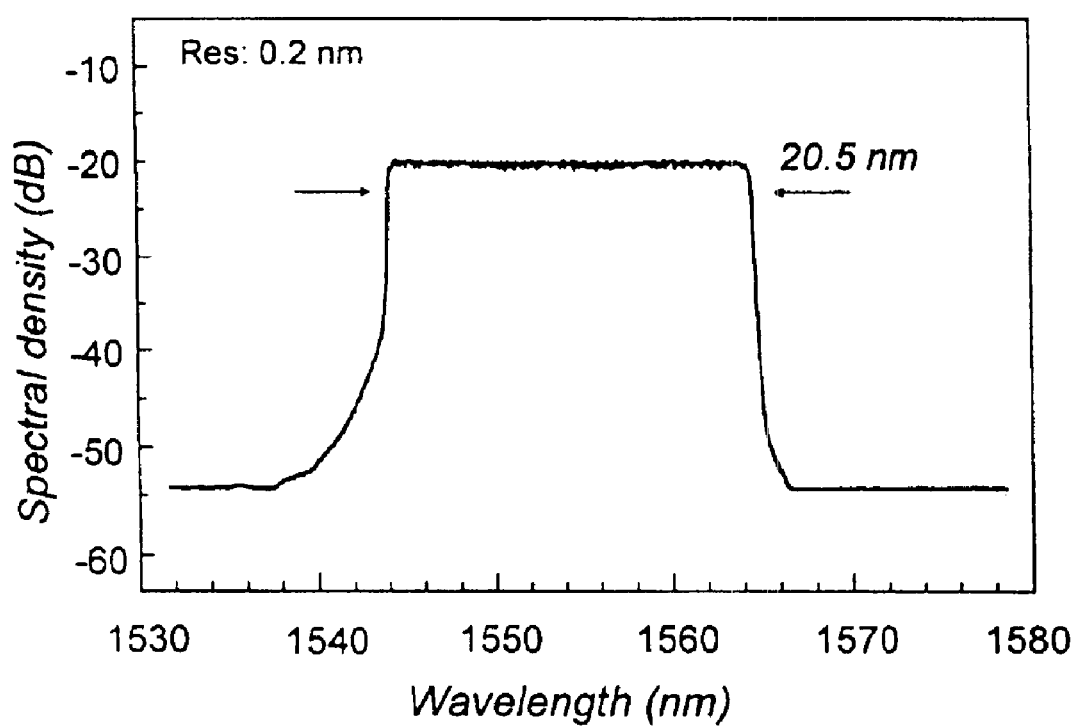
FIG. 21 shows experimental measurements of the time-averaged spectrum over a scan of 20 nm.
Figure 22:
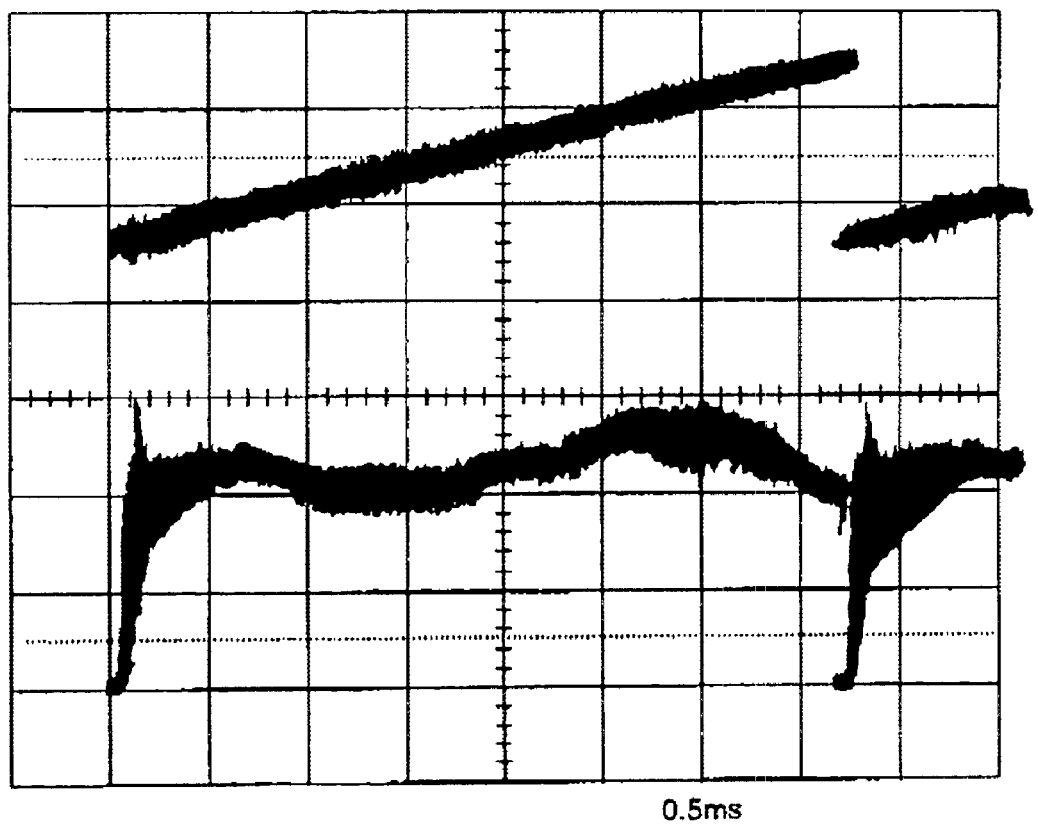
FIG. 22 shows experimental measurements of the instantaneous output power as a function of time as the source is swept.

The time average output from the source as measured on the peak hold function of an optical spectrum analyser over repeated scans on resonance is shown in FIG. 21 where it can be seen that a well defined square average output spectrum was obtained with less than 1.0 dB variation across the full sweep range of 20 nm (average output power 100 mW). Variations of <0.4 dB (output power 102 mW) and <6 dB (output power 91 mW) were achieved for resonant sweeps of 10 nm and the maximum 38 nm, respectively. A plot of typical time domain behaviour under resonant sweeping conditions is shown in FIG. 22 where it is seen that after a brief period of relaxation oscillation at the beginning of the wavelength sweep the output settles to a reasonably level continuous wave output over the remainder of the scan.

Figure 23:
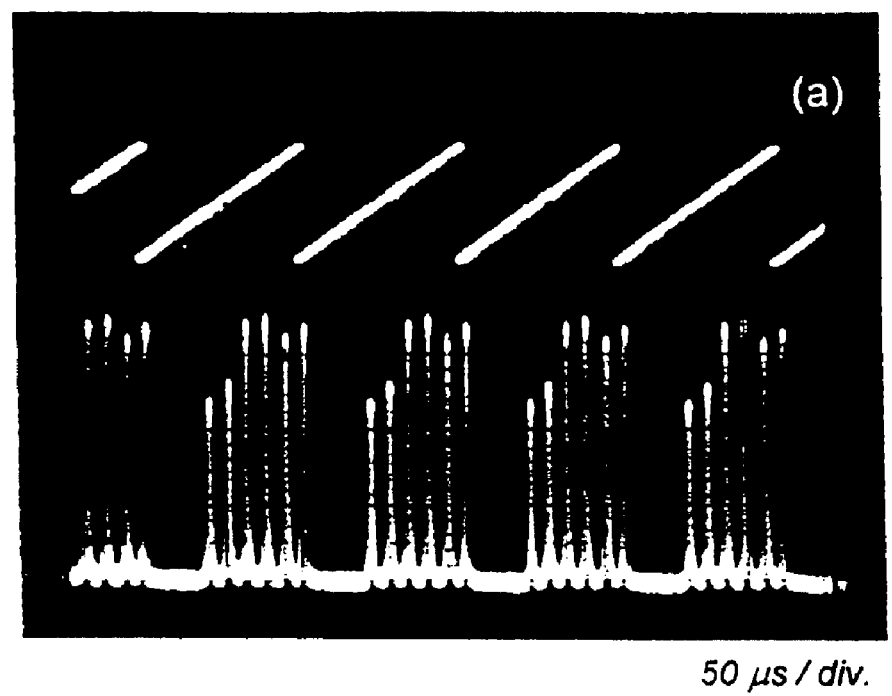
FIG. 23 shows experimental measurement of optical pulses emitted from the broadband laser source in a non-resonant condition.
Figure 24:
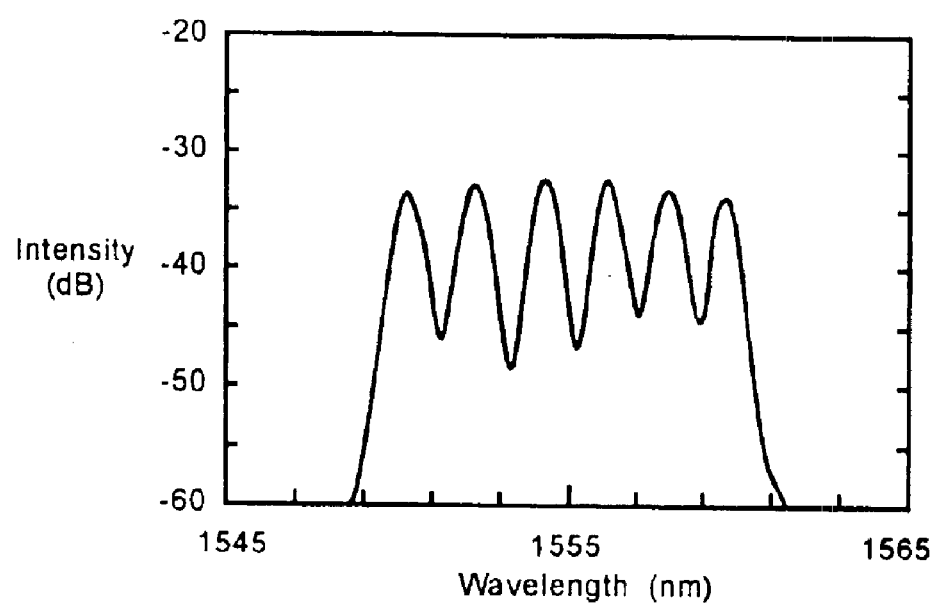
FIG. 24 shows the time-averaged spectrum corresponding to FIG. 23.

The spectral shape and output power were almost independent of the sweep frequency up to 7 kHz at the maximum pump power. However, as the sweep frequency increased higher than 7 kHz, the relaxation oscillation at the beginning of the sweep became so significant that the pulsed outputs were obtained, as shown in FIG. 23 and FIG. 24 in the case of a 10 nm sweep at $f_{sweep}$=9.3 kHz. The pulse repetition rate was ~80 kHz and output power 60 mW. Each individual pulse had a duration of order 1 micro second and was associated with one of the peaks in the spectral domain. The harder the system was pumped the greater the number of pulses per sweep cycle.

Figure 25:
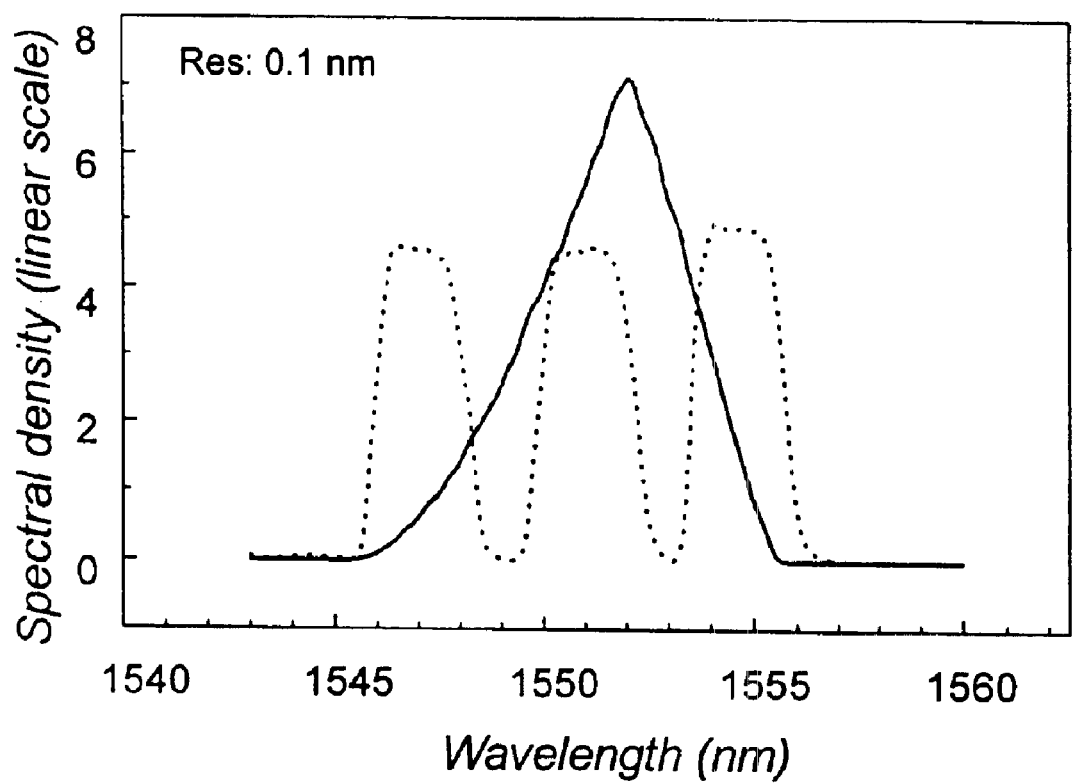
FIG. 25 shows experimental measurement of time-averaged shaped optical spectra obtained by synchronous modulation of the acousto-optic tuneable filter peak wavelength and attenuation in a resonant condition.

Finally, the possibilities for designer average spectral output profiles were investigated. This was done by simultaneously varying the attenuation through the acousto-optic tuneable filter 103 as its frequency was tuned. For this purpose there is demonstrated the generation of triangular and square wave modulated forms over a 10 nm wavelength span by using triangular-wave and square-wave signals from the second synthesiser 109, see FIG. 25.

It is to be appreciated that the embodiments of the invention described above with reference to the accompanying drawings have been given by way of example only and that modification and additional components may be provided to enhance the performance of the apparatus.

What is claimed is:

1. A broadband laser source comprising:

a resonant cavity containing a medium which emits optical energy in a continuum of wavelengths in response to application of pump energy to the medium;

a source of pump energy for producing said optical energy;

a frequency shifter within the resonant cavity; and a tuneable spectral filter within the resonant cavity;

the resonant cavity being a ring structure which contains a rare-earth doped single-mode optical fibre, an optical isolator, an input fibre coupler for coupling the pump energy into the resonant cavity, and an output fibre coupler through which broadband laser light exits the resonant cavity; and the apparatus being such that in use the tuneable spectral filter has a peak wavelength which is repeatedly swept in a substantially resonant fashion over a wavelength range equal to, or a fraction of, a linewidth of the broadband source such that the rate of change of the peak wavelength of the tuneable spectral filter is substantially equal to the rate of change of the frequency of the optical energy as it is frequency shifted within the resonant cavity by the frequency shifter.

2. A broadband laser source comprising:

a resonant cavity containing a medium which emits optical energy in a continuum of wavelengths in response to application of pump energy to the medium;

a source of pump energy for producing said optical energy;

a frequency shifter within the resonant cavity; and a tuneable spectral filter within the resonant cavity;

the resonant cavity being a unidirectional laser structure which contains a rare-earth doped single-mode optical fibre, an optical isolator for ensuring unidirectional operation, an input fibre coupler for coupling the pump energy into the resonant cavity, and an output fibre coupler through which the broadband laser light exits the resonant cavity; and the apparatus being such that in use the tuneable spectral filter has a peak wavelength which is repeatedly swept in a substantially resonant fashion over a wavelength range equal to, or a fraction of, a linewidth of the broadband source such that the rate of change of the peak wavelength of the tuneable spectral filter is substantially equal to the rate of change of the frequency of the optical energy as it is frequency shifted within the resonant cavity by the frequency shifter.

3. A broadband laser source according to claim 1 in which the tuneable spectral filter and the frequency shifter are embodied in an acousto-optic tuneable filter.

4. A broadband laser source according to claim 2 in which the tuneable spectral filter and the frequency shifter are embodied in an acousto-optic tuneable filter.

5. A broadband laser source comprising:

a resonant cavity containing a medium which emits optical energy in a continuum of wavelengths in response to application of pump energy to the medium;

a source of pump energy for producing said optical energy;

a frequency shifter within the resonant cavity;

a tuneable spectral filter within the resonant cavity; and an output coupling arrangement containing at least one narrow bandwidth optical filter; and the apparatus being such that in use the tuneable spectral filter has a peak wavelength which is repeatedly swept in a substantially resonant fashion over a wavelength range equal to, or a fraction of, a linewidth of the broadband source such that the rate of change of the peak wavelength of the tuneable spectral filter is substantially equal to the rate of change of the frequency of the optical energy as it is frequency shifted within the resonant cavity by the frequency shifter.

6. A broadband laser source according to claim 5 in which the resonant cavity is a fabry-perot structure.

7. A broadband laser source comprising:

a resonant cavity containing a medium which emits optical energy in a continuum of wavelengths in response to application of pump energy to the medium;

a source of pump energy for producing said optical energy;

a frequency shifter within the resonant cavity; and a tuneable spectral filter within the resonant cavity;

the apparatus being such that in use the tuneable spectral filter has a peak wavelength which is repeatedly swept in a substantially resonant fashion over a wavelength range equal to, or a fraction of, a linewidth of the broadband source such that the rate of change of the peak wavelength of the tuneable spectral filter is substantially equal to the rate of change of the frequency of the optical energy as it is frequency shifted within the resonant cavity by the frequency shifter; and the apparatus being such that the attenuation through the tuneable spectral filter is independently controlled as the peak wavelength of the tuneable spectral filter is swept.

8. A broadband laser source according to claim 7 in which the control of the peak wavelength and attenuation are provided by control signals which are phase locked.

9. Sensing apparatus comprising an array of environmentally-sensitive narrow-band reflectors and a broadband laser source, in which the broadband laser source comprises:

a resonant cavity containing a medium which emits optical energy in a continuum of wavelengths in response to application of pump energy to the medium;

a source of pump energy for producing said optical energy;

a frequency shifter within the resonant cavity; and a tuneable spectral filter within the resonant cavity;

and the apparatus being such that in use the tuneable spectral filter has a peak wavelength which is repeatedly swept in a substantially resonant fashion over a wavelength range equal to, or a fraction of, a linewidth of the broadband source such that the rate of change of the peak wavelength of the tuneable spectral filter is substantially equal to the rate of change of the frequency of the optical energy as it is frequency shifted within the resonant cavity by the frequency shifter.

10. Sensing apparatus comprising at least one interferometer and a broadband laser source, in which the broadband laser source comprises:

a resonant cavity containing a medium which emits optical energy in a continuum of wavelengths in response to application of pump energy to the medium;

a source of pump energy for producing said optical energy;

a frequency shifter within the resonant cavity; and a tuneable spectral filter within the resonant cavity, and the apparatus being such that in use the tuneable spectral filter has a peak wavelength which is repeatedly swept in a substantially resonant fashion over a wavelength range equal to, or a fraction of, a linewidth of the broadband source such that the rate of change of the peak wavelength of the tuneable spectral filter is substantially equal to the rate of change of the frequency of the optical energy as it is frequency shifted within the resonant cavity by the frequency shifter.

\* \* \* \* \*